(12) United States Patent
Takeuchi

(10) Patent No.: US 9,917,569 B2
(45) Date of Patent: Mar. 13, 2018

(54) HIGH-FREQUENCY MODULE

(71) Applicant: Murata Manufacturing Co., Ltd., Nagaokakyo-shi, Kyoto-fu (JP)

(72) Inventor: Morio Takeuchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 114 days.

(21) Appl. No.: 15/016,860

(22) Filed: Feb. 5, 2016

(65) Prior Publication Data
US 2016/0156335 A1 Jun. 2, 2016

Related U.S. Application Data

(63) Continuation of application No. PCT/JP2014/068548, filed on Jul. 11, 2014.

(30) Foreign Application Priority Data

Aug. 6, 2013 (JP) .................. 2013-163268

(51) Int. Cl.
*H03H 9/72* (2006.01)
*H03H 9/64* (2006.01)
(Continued)

(52) U.S. Cl.
CPC .............. *H03H 9/725* (2013.01); *H03H 7/38* (2013.01); *H03H 9/542* (2013.01);
(Continued)

(58) Field of Classification Search
CPC ........ H03H 7/38; H03H 9/542; H03H 9/6433; H03H 9/6479; H03H 9/725; H03H 9/0009; H03H 9/0057; H03H 9/605; H03H 9/6483
(Continued)

(56) References Cited

U.S. PATENT DOCUMENTS 7,583,161 B2 *  9/2009  Tanaka ................. H03H 9/0576
                                                              333/133
7,978,019 B2 *  7/2011  Wiesbauer ............. H01P 1/213
                                                              333/12
(Continued)

FOREIGN PATENT DOCUMENTS

JP        62-261211 A    11/1987
JP         64-36112 A     2/1989
(Continued)

OTHER PUBLICATIONS

Novgorodov et al. "Modified Ladder-Type 2.4GHz SAW Filter with Transmission Zero", IEEE Ultrasonics Symposium Oct. 2010, pp. 2083-2086.*

(Continued)

*Primary Examiner* — Robert J Pascal
*Assistant Examiner* — Jorge Salazar, Jr.
(74) *Attorney, Agent, or Firm* — Keating & Bennet, LLP

(57) ABSTRACT

A high frequency module includes a first external connection terminal, a second external connection terminal, a filter unit, a first matching circuit, and a second matching circuit. The filter unit is connected between the first external connection terminal and the second external connection terminal. The first matching circuit is connected between the first external connection terminal and the filter unit. The second matching circuit is connected between the second external connection terminal and the filter unit. The first matching circuit and the second matching circuit are inductively or capacitively coupled to each other.

13 Claims, 9 Drawing Sheets

(51) Int. Cl.
  *H03H 9/54* (2006.01)
  *H03H 7/38* (2006.01)
  *H03H 9/00* (2006.01)
  *H03H 9/60* (2006.01)

(52) U.S. Cl.
  CPC ........ *H03H 9/6433* (2013.01); *H03H 9/6479* (2013.01); *H03H 9/0009* (2013.01); *H03H 9/0057* (2013.01); *H03H 9/605* (2013.01); *H03H 9/6483* (2013.01)

(58) Field of Classification Search
  USPC .......................... 333/133, 187, 188, 193–196
  See application file for complete search history.

(56) References Cited

U.S. PATENT DOCUMENTS

| | | | |
|---|---|---|---|
| 2006/0091977 A1 | 5/2006 | Inoue et al. | |
| 2008/0266023 A1 | 10/2008 | Tanaka | |
| 2010/0026414 A1 | 2/2010 | Iwaki et al. | |
| 2012/0119847 A1 | 5/2012 | Iwaki et al. | |
| 2012/0286900 A1 | 11/2012 | Kadota et al. | |
| 2015/0137909 A1 | 5/2015 | Okuda et al. | |

FOREIGN PATENT DOCUMENTS

| | | |
|---|---|---|
| JP | 2006-135447 A | 5/2006 |
| JP | 2010-41097 A | 2/2010 |
| JP | 2010-192974 A | 9/2010 |
| JP | 2012-109818 A | 6/2012 |
| WO | 2007/083432 A1 | 7/2007 |
| WO | 2011/093449 A1 | 8/2011 |
| WO | 2014/034373 A1 | 3/2014 |

OTHER PUBLICATIONS

Official Communication issued in International Application PCT/JP2014/068548, dated Sep. 30, 2014.

* cited by examiner

HIGH-FREQUENCY MODULE

BACKGROUND OF THE INVENTION

1. Field of the Invention

The present invention relates to high frequency modules provided with a plurality of filter devices.

2. Description of the Related Art

In general, a mobile apparatus or the like having a wireless communication function includes a filter circuit that passes only a high frequency signal of a desired frequency and attenuates high frequency signals having frequencies other than the desired frequency.

For example, Japanese Unexamined Patent Application Publication No. 2012-109818 discloses a filter circuit including a plurality of surface acoustic wave (SAW) filters. To be more specific, in the filter circuit disclosed in Japanese Unexamined Patent Application Publication No. 2012-109818, the plurality of SAW filters are connected in series between an input terminal and an output terminal. Further, additional SAW filers are connected between the ground and each connection line with which the SAW filters are connected in series.

In the filter circuit disclosed in Japanese Unexamined Patent Application Publication No. 2012-109818, an inductor or a series circuit of an inductor and a capacitor (called a "correction circuit") is connected in parallel to the series circuit of the SAW filters to improve attenuation characteristics outside a pass band. In this case, the correction circuit is adjusted such that a high frequency signal outside the pass band (suppression target signal) propagating in the circuit formed of the SAW filters and a suppression target signal propagating in the correction circuit have the same amplitude in magnitude and have opposite phases to each other. With this, the suppression target signals cancel each other out at a connection point between the circuit formed of the SAW filters and the correction circuit, and are not outputted from the output terminal.

However, in the above configuration, in addition to the circuit formed of the SAW filters having a principal filter function, only to improve attenuation characteristics, the correction circuit formed of an inductor or a series circuit of an inductor and a capacitor needs to be provided.

This increases the number of constituent elements of the filter circuit and consequently makes the filter circuit large in size. Therefore, the above filter circuit is not suitable for use in today's mobile terminals and the like required to be compact.

SUMMARY OF THE INVENTION

Preferred embodiments of the present invention provide a high frequency module including a compact filter circuit excellent in attenuation characteristics outside a pass band.

A preferred embodiment of the present invention relates to a high frequency module including a first external connection terminal, a second external connection terminal, a filter unit connected between the first external connection terminal and the second external connection terminal, a first matching circuit connected between the first external connection terminal and the filter unit, and a second matching circuit connected between the second external connection terminal and the filter unit, where the first matching circuit and the second matching circuit are inductively or capacitively coupled to each other.

In this configuration, a sub propagation path includes an inductive or capacitive coupling path generated by the first matching circuit and the second matching circuit, in addition to a main propagation path through which a high frequency signal propagates in the filter unit. The sub propagation path has a different amplification characteristic and a different phase characteristic from those of the main propagation path in accordance with a coupling degree of the inductive or capacitive coupling, and transmission characteristics of the high frequency module are adjustable by adjusting the amplification characteristic and the phase characteristic of the sub propagation path. This makes it possible to improve attenuation characteristics, for example, by adjusting the transmission characteristics of the high frequency module without additionally providing an inductor, a capacitor, or the like.

Further, in a high frequency module according to a preferred embodiment of the present invention, it is preferable for the filter unit to include a first series connection terminal connected to the first external connection terminal, a second series connection terminal connected to the second external connection terminal, and a plurality of series connection-type filter devices connected in series between the first series connection terminal and the second series connection terminal.

In this configuration, combining bandpass characteristics and attenuation characteristics of the plurality of filter devices makes it possible to realize a desired bandpass characteristic and desired attenuation characteristics outside a pass band of the filter unit.

Further, in a high frequency module according to a preferred embodiment of the present invention, it is preferable for the first matching circuit and the second matching circuit to be inductively or capacitively coupled to each other such that impedance of the filter unit outside the pass band changes.

As described in this configuration, by appropriately adjusting the coupling mode, the coupling degree, or the like, characteristics at the outside of the pass band, that is, the attenuation characteristics are able to be changed without changing characteristics of the pass band.

Further, in a high frequency module according to a preferred embodiment of the present invention, it is preferable for the first matching circuit and the second matching circuit to be inductively or capacitively coupled to each other such that an attenuation pole frequency of the filter unit outside the pass band changes.

In this configuration, the attenuation pole frequency is adjusted as an adjustment mode of the attenuation characteristics.

Further, a high frequency module according to a preferred embodiment of the present invention may be configured as follows. That is, the first matching circuit is a series connection-type matching circuit connected in series between the first external connection terminal and the filter unit, or a shunt connection-type matching circuit connected between the ground and a connection line that connects the first external connection terminal and the filter unit. The second matching circuit is a series connection-type matching circuit connected in series between the second external connection terminal and the filter unit, or a shunt connection-type matching circuit connected between the ground and a connection line that connects the second external connection terminal and the filter unit.

In this configuration, specific connection modes of the matching circuits are described. Determining these connection modes in an appropriate manner makes it possible to properly adjust the above-mentioned attenuation characteristics while properly carrying out impedance matching between the filter unit and the exterior.

Further, a high frequency module according to a preferred embodiment of the present invention may be configured as follows. That is, the filter unit includes a third terminal and a second filter unit. The second filter unit is connected between the third terminal and a connection line that connects the first series connection terminal and the filter device to be connected to the first series connection terminal.

With such a configuration, a multiplexer/demultiplexer (a duplexer or the like) in which the first series connection terminal defines and functions as a common terminal and the second series connection terminal and the third terminal define and function as individual terminals, is provided.

Further, a high frequency module according to a preferred embodiment of the present invention may be configured as follows. That is, the high frequency module includes a plate-shaped filter substrate on a first principal surface of which an interdigital transducer (IDT) electrode of the filter unit is provided, a cover layer opposing the first principal surface of the filter substrate with a space interposed therebetween, a connection electrode protruding from the first principal surface so as to penetrate the cover layer, and a laminated substrate where the first matching circuit and the second matching circuit are mounted or located. The filter substrate is disposed such that the first principal surface side thereof faces a mounting surface of the laminated substrate. The filter substrate is connected to the laminated substrate through the connection electrode.

With this configuration, a high frequency module including a filter unit with a wafer level package (WLP) and the laminated substrate is provided such that the high frequency module is miniaturized.

Further, a high frequency module according to a preferred embodiment of the present invention may be configured as follows. That is, the high frequency module includes a plate-shaped filter substrate on a first principal surface of which an IDT electrode of the filter unit is provided, a connection electrode protruding from the first principal surface, a laminated substrate where the first matching circuit and the second matching circuit are mounted or located, and a resin layer that seals the filter unit. The filter substrate is disposed such that the first principal surface side thereof opposes a mounting surface of the laminated substrate with a space interposed therebetween. The filter substrate is connected to the laminated substrate through the connection electrode. The resin layer covers the mounting surface of the laminated substrate where the filter substrate is disposed.

With this configuration, the high frequency module includes the filter unit including a bare chip and the laminated substrate, such that the high frequency module is miniaturized.

Furthermore, a high frequency module according to a preferred embodiment of the present invention may be configured as follows. That is, the first matching circuit and the second matching circuit each include a surface-mount circuit element mounted on the mounting surface of the laminated substrate. The first matching circuit and the second matching circuit are located close to each other.

In this configuration, an example of a specific configuration of the first matching circuit and the second matching circuit is described. With this configuration, the coupling of the first matching circuit and the second matching circuit is able to be realized with certainty.

Further, it is preferable for a high frequency module according to a preferred embodiment of the present invention to be configured as follows. That is, the first matching circuit and the second matching circuit each include a housing preferably having a rectangular or substantially rectangular parallelepiped shape and a spiral conductor that is located inside the housing and has a shape of an outer circumference of a rectangular or substantially rectangular shape when viewed from above. A longer side of the housing of the first matching circuit is close to a longer side of the housing of the second matching circuit.

This configuration makes it possible to easily obtain the coupling of the first matching circuit and the second matching circuit and also easily adjust the coupling to a desired coupling amount.

Further, a high frequency module according to a preferred embodiment of the present invention may be configured as follows. That is, the first matching circuit and the second matching circuit are provided on the mounting surface of the laminated substrate or provided inside the laminated substrate. The first matching circuit and the second matching circuit overlap with each other when viewed in a lamination direction of the laminated substrate.

Furthermore, a high frequency module according to a preferred embodiment of the present invention may be configured as follows. That is, the first matching circuit and the second matching circuit are provided inside the laminated substrate. The first matching circuit and the second matching circuit overlap with each other when viewed in a direction parallel or substantially parallel to the mounting surface of the laminated substrate.

In these configurations, examples of specific configurations of the first matching circuit and the second matching circuit are described. With these configurations, the coupling of the first matching circuit and the second matching circuit is realized with certainty.

Moreover, the first matching circuit or the second matching circuit may be provided inside the cover layer.

In this configuration, an example of a specific configuration of the first matching circuit or the second matching circuit is described.

Further, a high frequency module according to a preferred embodiment of the present invention may be configured as follows. That is, the high frequency module includes a plate-shaped filter substrate on a first principal surface of which an IDT electrode of the filter unit is provided, and a plate-shaped filter mounting substrate which is disposed on the first principal surface side of the filter substrate and on which the first principal surface side of the filter substrate is mounted. The first matching circuit and the second matching circuit are mounted or located on the filter mounting substrate.

In this configuration, an example in which the high frequency module is realized using a chip size package (CSP) is described.

According to various preferred embodiments of the present invention, a high frequency module equipped with a compact filter circuit having excellent attenuation characteristics at the outside of the pass band is realized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
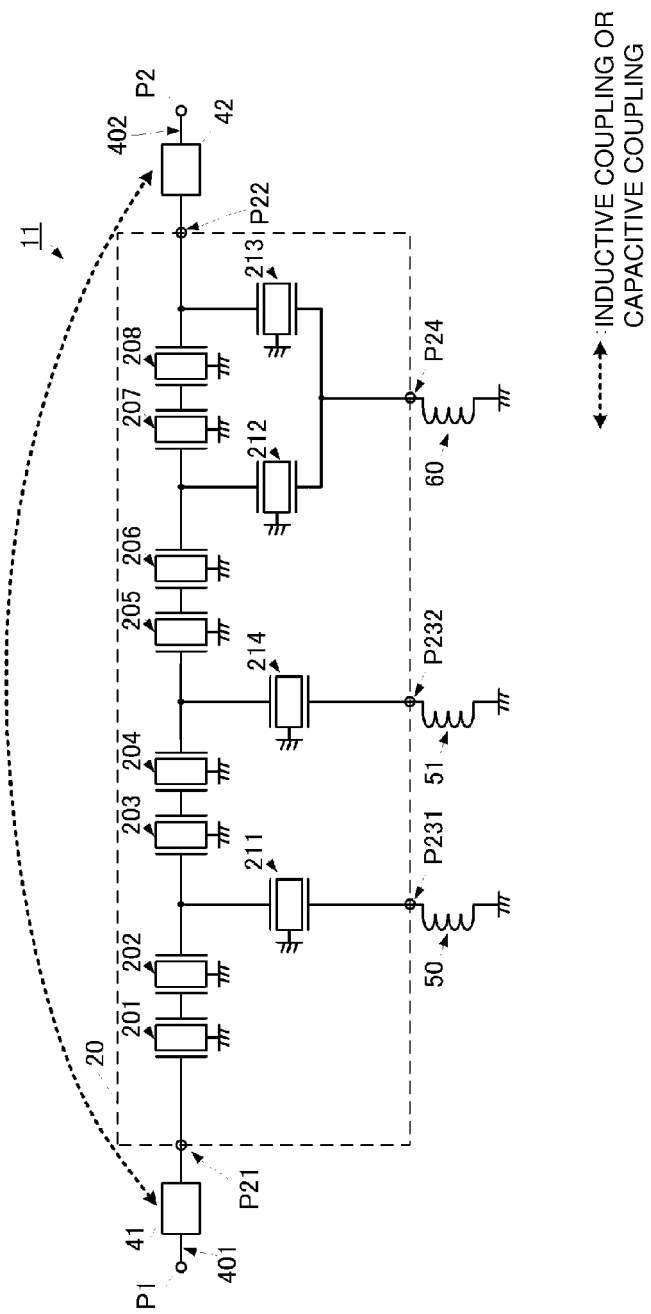
FIG. 1 is a circuit block diagram illustrating a first circuit example of a high frequency module according to a preferred embodiment of the present invention.
Figure 2:
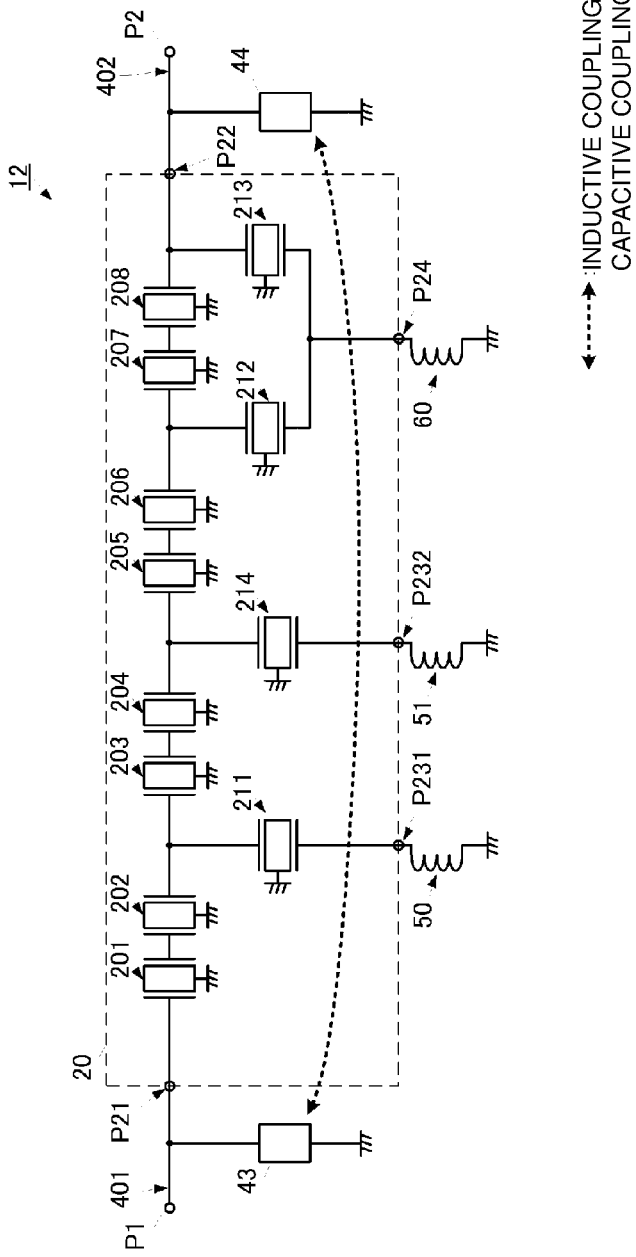
FIG. 2 is a circuit block diagram illustrating a second circuit example of a high frequency module according to a preferred embodiment of the present invention.
Figure 3:
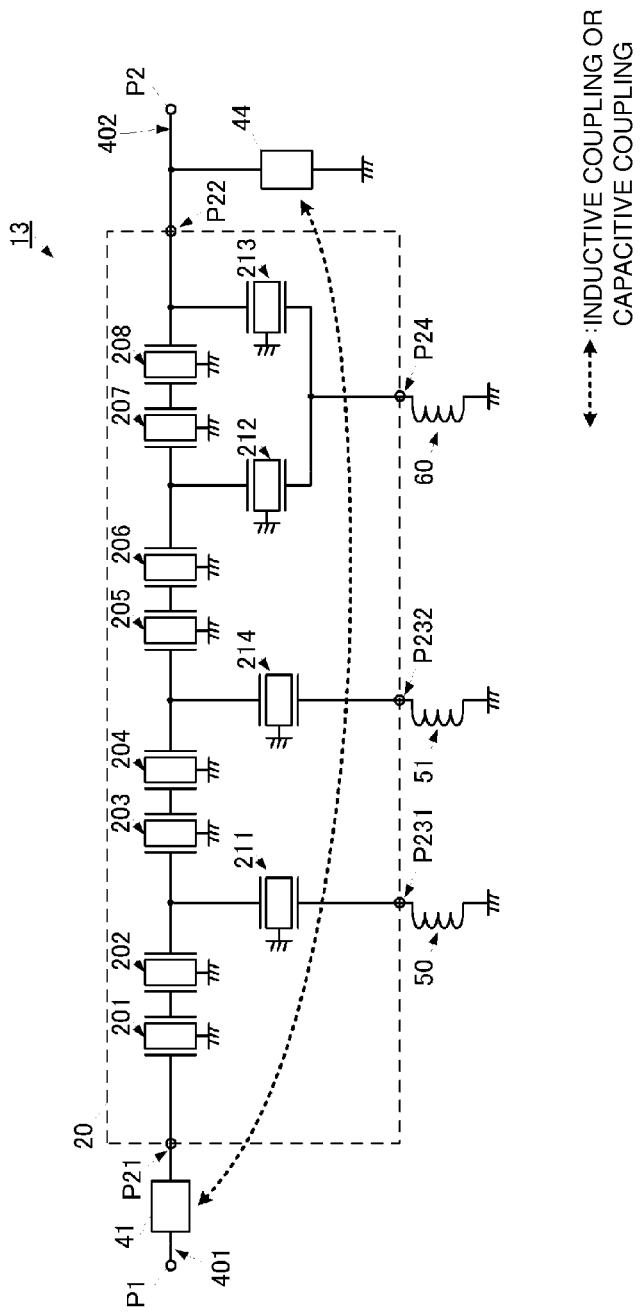
FIG. 3 is a circuit block diagram illustrating a third circuit example of a high frequency module according to a preferred embodiment of the present invention.
Figure 4:
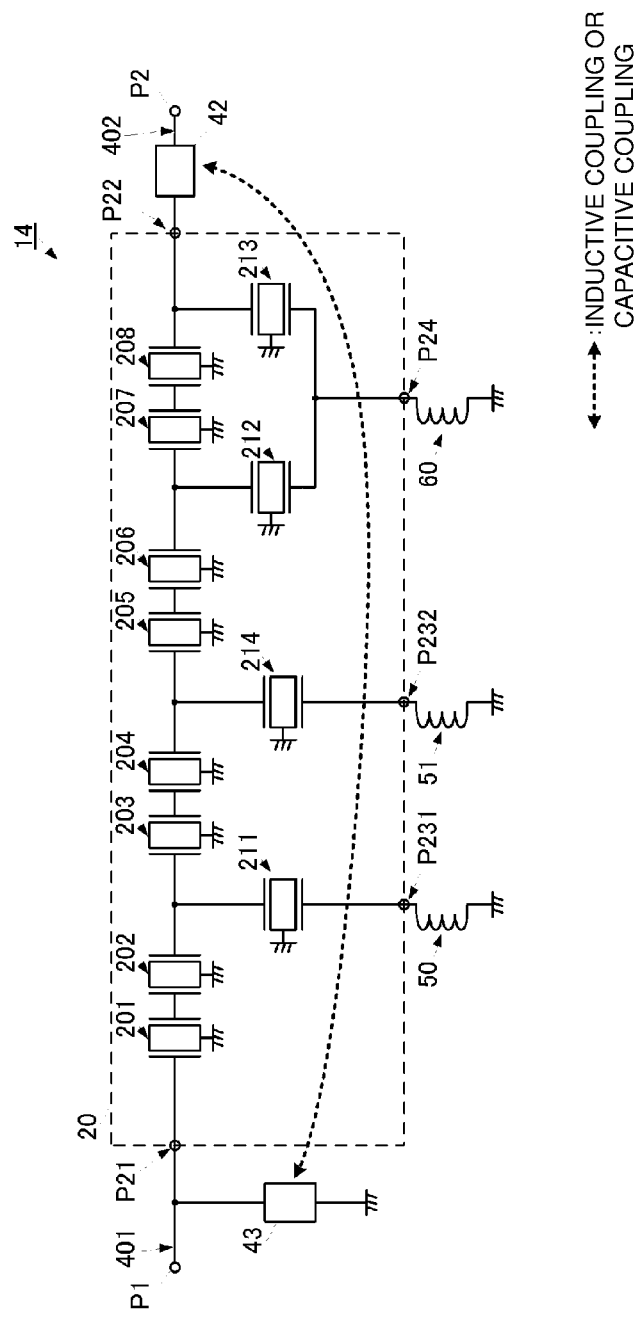
FIG. 4 is a circuit block diagram illustrating a fourth circuit example of a high frequency module according to a preferred embodiment of the present invention.

High frequency modules according to various preferred embodiments of the present invention will be described with reference to the drawings. FIG. 1 is a circuit block diagram illustrating a first circuit example of a high frequency module according to a preferred embodiment of the present invention. FIG. 2 is a circuit block diagram illustrating a second circuit example of a high frequency module according to the present preferred embodiment of the present invention. FIG. 3 is a circuit block diagram illustrating a third circuit example of a high frequency module according to the present preferred embodiment of the present invention. FIG. 4 is a circuit block diagram illustrating a fourth circuit example of a high frequency module according to the present preferred embodiment of the present invention. FIG. 5A through FIG. 5D are circuit diagrams illustrating specific examples of a first matching circuit on a first external connection terminal side. FIG. 5E through FIG. 5H are circuit diagrams illustrating specific examples of a second matching circuit on a second external connection terminal side.

First, a circuit configuration common to high frequency modules 11, 12, 13, and 14 shown in FIGS. 1 through 4, respectively, will be described.

The high frequency modules 11, 12, 13, and 14 each include a first external connection terminal P1, a second external connection terminal P2, and a filter unit 20. The filter unit 20 is connected between the first external connection terminal P1 and the second external connection terminal P2.

The filter unit 20 includes a first series connection terminal P21, a second series connection terminal P22, first shunt connection terminals P231 and P232, and a second shunt connection terminal P24. The first series connection terminal P21 is connected to the first external connection terminal P1 through a series connection-type first matching circuit or a shunt connection-type first matching circuit, which will be explained later. The second series connection terminal P22 is connected to the second external connection terminal P2 through a series connection-type second matching circuit or a shunt connection-type second matching circuit, which will be explained later.

The first shunt connection terminal P231 is connected to the ground through an inductor 50. The first shunt connection terminal P232 is connected to the ground through an inductor 51. The second shunt connection terminal P24 is connected to the ground through an inductor 60.

The filter unit 20 preferably includes a plurality of SAW resonators 201, 202, 203, 204, 205, 206, 207, and 208 (hereinafter, simply called the plurality of "SAW resonators 201-208" in the case where the plurality of SAW resonators are collectively described). These SAW resonators correspond to "series connection-type filter devices". The filter unit 20 further includes a plurality of SAW resonators 211, 212, 213, and 214. The filter unit 20 may include only the plurality of SAW resonators 201-208 connected in series while omitting the SAW resonators 211, 212, 213, and 214.

The plurality of SAW resonators 201-208, 211, 212, 213, and 214 each have a resonant frequency and function as a band pass filter (BPF) having its own bandpass characteristic. The plurality of SAW resonators 201-208 are connected in series between the first series connection terminal P21 and the second series connection terminal P22.

The SAW resonator 211 is connected between a connection point of the SAW resonators 202, 203 and the first shunt connection terminal P231. The SAW resonator 214 is connected between a connection point of the SAW resonators 204, 205 and the first shunt connection terminal P232.

The SAW resonator 212 is connected between a connection point of the SAW resonators 206, 207 and the second shunt connection terminal P24. The SAW resonator 213 is connected between the second shunt connection terminal P24 and a connection point of the SAW resonators 208 and the second series connection terminal P22. In other words, the second shunt connection terminal P24 is a common terminal to the SAW resonators 212 and 213, and each one end of the SAW resonators 212 and 213 is joined and connected to the ground.

With a unique structure as described above, the filter unit 20 defines what is called a ladder connection-type filter, and realizes a desired bandpass characteristic and desired attenuation characteristics outside the pass band as the filter unit 20 by combining bandpass characteristics and attenuation characteristics of the SAW resonators 201-208, 211, 212, 213, and 214. Note that the number, arrangement, and so on of the SAW resonators may be appropriately changed so as to obtain a frequency band of the signal to pass and desired attenuation characteristics outside the pass band.

Aside from the common circuit configuration to the high frequency modules 11, 12, 13, and 14, the respective high frequency modules preferably include the following circuit configurations.

First Circuit Example

The high frequency module 11 shown in FIG. 1 includes a series connection-type first matching circuit 41 and a series connection-type second matching circuit 42.

Figure 5A:
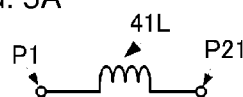
FIGS. 5A-5H include circuit diagrams illustrating specific examples of matching circuits of the high frequency modules shown in FIGS. 1 through 4.
Figure 5E:
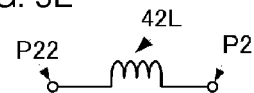
Figure 5B:
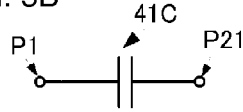

The first matching circuit 41 is connected between the first series connection terminal P21 of the filter unit 20 and the first external connection terminal P1. Specifically, the first matching circuit 41 is an inductor 41L connected in series between the first series connection terminal P21 and the first external connection terminal P1 as shown in FIG. 5A, or a capacitor 41C connected in series between the first series connection terminal P21 and the first external connection terminal P1 as shown in FIG. 5B. The element value (inductance or capacitance) of the first matching circuit 41 is set to an element value that realizes impedance matching between a circuit connected on the first external connection terminal P1 side and the filter unit 20.

Figure 5F:
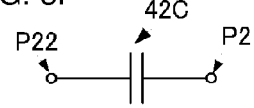

The second matching circuit 42 is connected between the second series connection terminal P22 of the filter unit 20 and the second external connection terminal P2. Specifically, the second matching circuit 42 is an inductor 42L connected in series between the second series connection terminal P22 and the second external connection terminal P2 as shown in FIG. 5E, or a capacitor 42C connected in series between the second series connection terminal P22 and the second external connection terminal P2 as shown in FIG. 5F. The element value (inductance or capacitance) of the second matching circuit 42 is set to an element value that realizes impedance matching between a circuit connected on the second external connection terminal P2 side and the filter unit 20.

Further, the first matching circuit 41 and the second matching circuit 42 are inductively or capacitively coupled to each other. In the case where, for example, the first matching circuit 41 includes the inductor 41L and the second matching circuit 42 includes the inductor 42L, a conductor defining the inductor 41L and a conductor defining the inductor 42L are inductively or capacitively coupled to each other. In the case where the first matching circuit 41 includes the capacitor 41C and the second matching circuit 42 includes the capacitor 42C, the capacitor 41C and the capacitor 42C are capacitively coupled to each other.

Further, in the case where, for example, the first matching circuit 41 includes the inductor 41L and the second matching circuit 42 includes the capacitor 42C, the conductor defining the inductor 41L and a conductor defining the capacitor 42C are capacitively coupled to each other Likewise, in the case where the first matching circuit 41 includes the capacitor 41C and the second matching circuit 42 includes the inductor 42L, a conductor defining the capacitor 41C and the conductor defining the inductor 42L are capacitively coupled to each other.

By adopting this configuration, the first matching circuit 41 and the second matching circuit 42 are connected to each other at high frequencies. For example, in the case where the inductor 41L as the first matching circuit 41 and the inductor 42L as the second matching circuit 42 are inductively coupled to each other (see FIG. 1), an inductive coupling circuit having mutual inductance is provided between the inductor 41L and the inductor 42L. Because of this, between the first external connection terminal P1 and the second external connection terminal P2, the high frequency signal is propagated not only through a main propagation path including the filter unit 20 as a propagation path, and portion of the high frequency signal is propagated also through a sub propagation path including the inductor 41L (first matching circuit 41), the inductive coupling circuit, and the inductor 42L (second matching circuit 42) as a propagation path.

As a result, the high frequency module 11 exhibits combined transmission characteristics in which transmission characteristics of the main transmission path and transmission characteristics of the sub transmission path are combined.

Here, by adjusting a coupling mode and a coupling degree between the matching circuits to be coupled and the inductors, the amplitude and phase of the high frequency signal propagating in the sub transmission path are adjustable. To rephrase, the transmission characteristics of the sub transmission path are adjustable. In this case, the transmission characteristics refer to, for example, attenuation characteristics (amplitude characteristic), a phase characteristic, and so on.

Further, adjusting the above coupling mode and coupling degree makes it possible to give influence only on the attenuation characteristics outside the pass band caused by the setting of the sub transmission path while hardly giving influence on the transmission characteristics in the frequency band of the high frequency signal which the high frequency module 11 intends to pass (desired high frequency signal).

By adjusting the transmission characteristics of the sub transmission path as described above, transmission characteristics of the high frequency module 11 are adjustable. For example, attenuation characteristics outside the pass band are adjustable as explained later.

In this case, unlike the conventional configuration, an inductor, a capacitor, or the like to adjust transmission characteristics of a high frequency filter is not additionally needed. Therefore, the high frequency filter having desired attenuation characteristics is able to be realized with a simplified configuration. This makes it possible to achieve a compact high frequency filter.

Moreover, by the mutual induction caused by the above-mentioned coupling, the effective impedance of the inductor 41L (first matching circuit 41) and the inductor 42L (second matching circuit 42) is significantly increased. This makes it possible for each line length of the inductor 41L and the inductor 42L to be shorter.

Second Circuit Example

The high frequency module 12 shown in FIG. 2 includes a shunt connection-type first matching circuit 43 and a shunt connection-type second matching circuit 44.

Figure 5C:
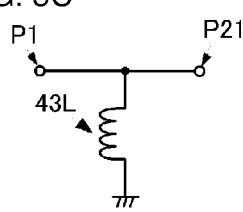
Figure 5G:
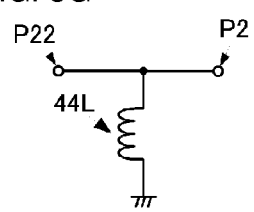
Figure 5D:
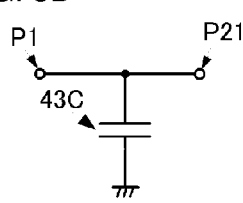

The first matching circuit 43 is connected between the ground and a connection line 401 that connects the first series connection terminal P21 of the filter unit 20 and the first external connection terminal P1. Specifically, the first matching circuit 43 includes an inductor 43L connected between the ground and the connection line 401 that connects the first series connection terminal P21 and the first external connection terminal P1 as shown in FIG. 5C, or a capacitor 43C connected between the ground and the connection line 401 that connects the first series connection terminal P21 and the first external connection terminal P1 as shown in FIG. 5D. The element value (inductance or capacitance) of the first matching circuit 43 is set to an element value that realizes impedance matching between a circuit connected on the first external connection terminal P1 side and the filter unit 20.

Figure 5H:
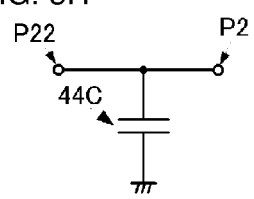

The second matching circuit 44 is connected between the ground and a connection line 402 that connects the second series connection terminal P22 of the filter unit 20 and the second external connection terminal P2. Specifically, the second matching circuit 44 includes an inductor 44L connected between the ground and the connection line 402 that connects the second series connection terminal P22 and the second external connection terminal P2 as shown in FIG. 5G, or a capacitor 44C connected between the ground and the connection line 402 that connects the second series connection terminal P22 and the second external connection terminal P2 as shown in FIG. 5H. The element value (inductance or capacitance) of the second matching circuit 44 is set to an element value that realizes impedance matching between a circuit connected on the second external connection terminal P2 side and the filter unit 20.

Further, the first matching circuit 43 and the second matching circuit 44 are inductively or capacitively coupled to each other. In the case where, for example, the first matching circuit 43 includes the inductor 43L and the second matching circuit 44 includes the inductor 44L, a conductor defining the inductor 43L and a conductor defining the inductor 44L are inductively or capacitively coupled to each other. In the case where the first matching circuit 43 includes the capacitor 43C and the second matching circuit 44 includes the capacitor 44C, the capacitor 43C and the capacitor 44C are capacitively coupled to each other.

Further, in the case where, for example, the first matching circuit 43 includes the inductor 43L and the second matching circuit 44 includes the capacitor 44C, the conductor defining the inductor 43L and a conductor defining the capacitor 44C are capacitively coupled to each other. Likewise, in the case where the first matching circuit 43 includes the capacitor 43C and the second matching circuit 44 includes the inductor 44L, a conductor defining the capacitor 43C and the conductor defining the inductor 44L are capacitively coupled to each other.

By adopting this configuration, the first matching circuit 43 and the second matching circuit 44 are connected to each other at high frequencies. For example, in the case where the capacitor 43C as the first matching circuit 43 and the capacitor 44C as the second matching circuit 44 are inductively coupled to each other (see FIG. 2), a capacitive coupling circuit having coupling capacitance is defined between the capacitor 43C and the capacitor 44C. Because of this, between the first external connection terminal P1 and the second external connection terminal P2, the high frequency signal is propagated not only through a main propagation path including the filter unit 20 as a propagation path, and portion of the high frequency signal is propagated also through a sub propagation path including the capacitor 43C (first matching circuit 43), the capacitive coupling circuit, and the capacitor 44C (second matching circuit 44) as a propagation path.

As a result, the high frequency module 12 exhibits combined transmission characteristics in which transmission characteristics of the main transmission path and transmission characteristics of the sub transmission path are combined.

With the high frequency module 12 having a unique structure as described above, it is also possible to realize the desired attenuation characteristics in a simpler configuration than the conventional configuration, like the high frequency module 11 discussed before.

Third Circuit Example

The high frequency module 13 shown in FIG. 3 includes the series connection-type first matching circuit 41 and the shunt connection-type second matching circuit 44.

The first matching circuit 41 is connected between the first series connection terminal P21 of the filter unit 20 and the first external connection terminal P1. Specifically, the first matching circuit 41 includes the inductor 41L connected in series between the first series connection terminal P21 and the first external connection terminal P1 as shown in FIG. 5A, or the capacitor 41C connected in series between the first series connection terminal P21 and the first external connection terminal P1 as shown in FIG. 5B. The element value (inductance or capacitance) of the first matching circuit 41 is set to an element value that realizes impedance matching between a circuit connected on the first external connection terminal P1 side and the filter unit 20.

The second matching circuit 44 is connected between the ground and the connection line 402 that connects the second series connection terminal P22 of the filter unit 20 and the second external connection terminal P2. Specifically, the second matching circuit 44 includes the inductor 44L connected between the ground and the connection line 402 that connects the second series connection terminal P22 and the second external connection terminal P2 as shown in FIG. 5G, or the capacitor 44C connected between the ground and the connection line 402 that connects the second series connection terminal P22 and the second external connection terminal P2 as shown in FIG. 5H. The element value (inductance or capacitance) of the second matching circuit 44 is set to an element value that realizes impedance matching between a circuit connected on the second external connection terminal P2 side and the filter unit 20.

Further, the first matching circuit 41 and the second matching circuit 44 are inductively or capacitively coupled to each other. In the case where, for example, the first matching circuit 41 includes the inductor 41L and the second matching circuit 44 includes the inductor 44L, the conductor defining the inductor 41L and the conductor defining the inductor 44L are inductively or capacitively coupled to each other. In the case where the first matching circuit 41 includes the capacitor 41C and the second matching circuit 44 includes the capacitor 44C, the capacitor 41C and the capacitor 44C are capacitively coupled to each other.

Further, in the case where, for example, the first matching circuit 41 includes the inductor 41L and the second matching circuit 44 includes the capacitor 44C, the conductor defining the inductor 41L and the conductor defining the capacitor 44C are capacitively coupled to each other. Likewise, in the case where the first matching circuit 41 includes the capacitor 41C and the second matching circuit 44 includes the inductor 44L, the conductor defining the capacitor 41C and the conductor defining the inductor 44L are capacitively coupled to each other.

As a result, the high frequency module 13 exhibits combined transmission characteristics in which transmission characteristics of the main transmission path extended through the filter unit 20 and transmission characteristics of the sub transmission path extended through the coupled portion are combined. With the high frequency module 13 having the unique structure described above, it is also possible to realize the desired attenuation characteristics in a simpler configuration than the conventional configuration, like the high frequency modules 11 and 12 discussed before.

Fourth Circuit Example

The high frequency module 14 shown in FIG. 4 includes the shunt connection-type first matching circuit 43 and the series connection-type second matching circuit 42.

The first matching circuit 43 is connected between the ground and the connection line 401 that connects the first series connection terminal P21 of the filter unit 20 and the first external connection terminal P1. Specifically, the first matching circuit 43 includes the inductor 43L connected between the ground and the connection line 401 that connects the first series connection terminal P21 and the first external connection terminal P1 as shown in FIG. 5C, or the capacitor 43C connected between the ground and the connection line 401 that connects the first series connection terminal P21 and the first external connection terminal P1 as shown in FIG. 5D. The element value (inductance or capacitance) of the first matching circuit 43 is set to an element value that realizes impedance matching between a circuit connected on the first external connection terminal P1 side and the filter unit 20.

The second matching circuit 42 is connected between the second series connection terminal P22 of the filter unit 20 and the second external connection terminal P2. Specifically, the second matching circuit 42 includes the inductor 42L connected in series between the second series connection terminal P22 and the second external connection terminal P2 as shown in FIG. 5E, or the capacitor 42C connected in series between the second series connection terminal P22 and the second external connection terminal P2 as shown in FIG. 5F. The element value (inductance or capacitance) of the second matching circuit 42 is set to an element value that realizes impedance matching between a circuit connected on the second external connection terminal P2 side and the filter unit 20.

Further, the first matching circuit 43 and the second matching circuit 42 are inductively or capacitively coupled to each other. In the case where, for example, the first matching circuit 43 includes the inductor 43L and the second matching circuit 42 includes the inductor 42L, the conductor defining the inductor 43L and the conductor defining the inductor 42L are inductively or capacitively coupled to each other. In the case where the first matching circuit 43 includes the capacitor 43C and the second matching circuit 42 includes the capacitor 42C, the capacitor 43C and the capacitor 42C are capacitively coupled to each other.

Furthermore, in the case where, for example, the first matching circuit 43 includes the capacitor 43C and the second matching circuit 42 includes the inductor 42L, the conductor defining the capacitor 43C and the conductor defining the inductor 42L are capacitively coupled to each other. Likewise, in the case where the first matching circuit 43 includes the inductor 43L and the second matching circuit 42 includes the capacitor 42C, the conductor defining the inductor 43L and the conductor defining the capacitor 42C are capacitively coupled to each other.

As a result, the high frequency module 14 exhibits combined transmission characteristics in which transmission characteristics of the main transmission path extended through the filter unit 20 and transmission characteristics of the sub transmission path extended through the coupled portion are combined. With the high frequency module 14 having the unique structure described above, it is also possible to realize the desired attenuation characteristics in a simpler configuration than the conventional configuration, like the high frequency modules 11, 12, and 13 discussed before.

Figure 6:
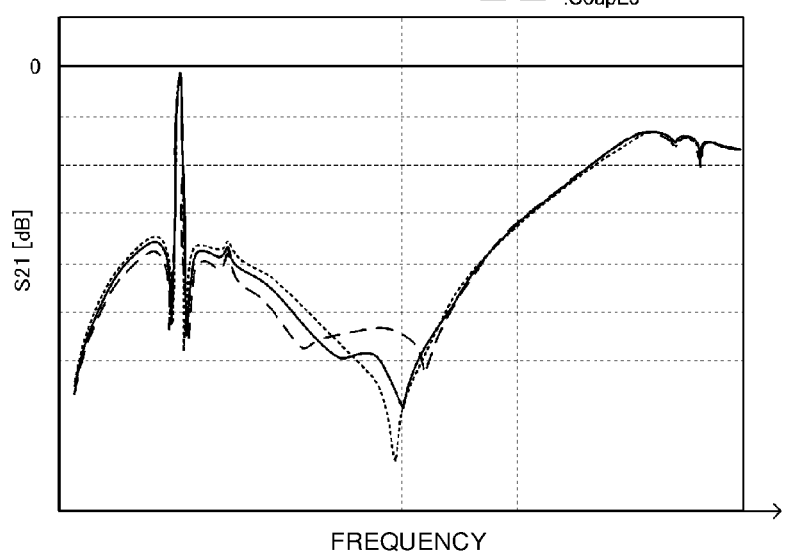
FIG. 6 is a graph illustrating a change in a bandpass characteristic of a high frequency module when a coupling degree of inductive coupling between a first matching circuit and a second matching circuit is changed.

FIG. 6 is a graph illustrating a change in a bandpass characteristic of a high frequency module when a coupling degree of inductive coupling between the first matching circuit and the second matching circuit is changed. The horizontal axis in FIG. 6 represents a frequency and the vertical axis therein represents attenuation of a signal propagating from the first external connection terminal P1 to the second external connection terminal P2. A dotted line characteristic shown in FIG. 6 indicates a case in which inductive coupling between the first matching circuit and the second matching circuit is weak. A solid line characteristic shown in FIG. 6 indicates a case in which the inductive coupling is stronger than the solid line characteristic. A broken line characteristic shown in FIG. 6 indicates a case in which the inductive coupling is stronger than the solid line characteristic. Note that the high frequency module of the present preferred embodiment preferably is a bandpass filter taking an 800 MHz band as a pass band, for example.

As shown in FIG. 6, as the inductive coupling is stronger, an attenuation pole frequency that appears on a higher frequency side of the pass band is higher. Note that the attenuation pole frequency in FIG. 6 refers to a peak frequency being present approximately at the center of the frequency axis.

By appropriately setting the inductive coupling, attenuation characteristics on the higher frequency side of the pass band are able to be changed. For example, as the inductive coupling is weaker, the attenuation near the pass band is smaller but the attenuation at the attenuation pole frequency is able to be made larger. Further, as the inductive coupling is stronger, the attenuation near the pass band is able to be made larger.

Then, as shown in FIG. 6, being not affected by the strength of inductive coupling, a frequency position, a frequency width, and insertion loss of the pass band are hardly changed.

Accordingly, by adopting the unique structure of the present preferred embodiment and appropriately adjusting the coupling degree of the inductive coupling, the attenuation characteristics on the higher frequency side are adjustable to desired characteristics without changing the characteristics of the pass band. In other words, a high frequency module having both a desired bandpass characteristic and desired attenuation characteristics is realized.

Although not illustrated, in the case where the first matching circuit and the second matching circuit are capacitively coupled to each other, as the capacitive coupling is stronger, the attenuation pole frequency that appears on the higher frequency side of the pass band is lower. Then, being not affected by the strength of capacitive coupling, a frequency position, a frequency width, and insertion loss of the pass band are hardly changed. Accordingly, by adopting the unique structure of the present preferred embodiment and appropriately adjusting the coupling degree of the capacitive coupling, the attenuation characteristics on the higher frequency side are adjustable to desired characteristics without changing the characteristics of the pass band.

Figure 7:
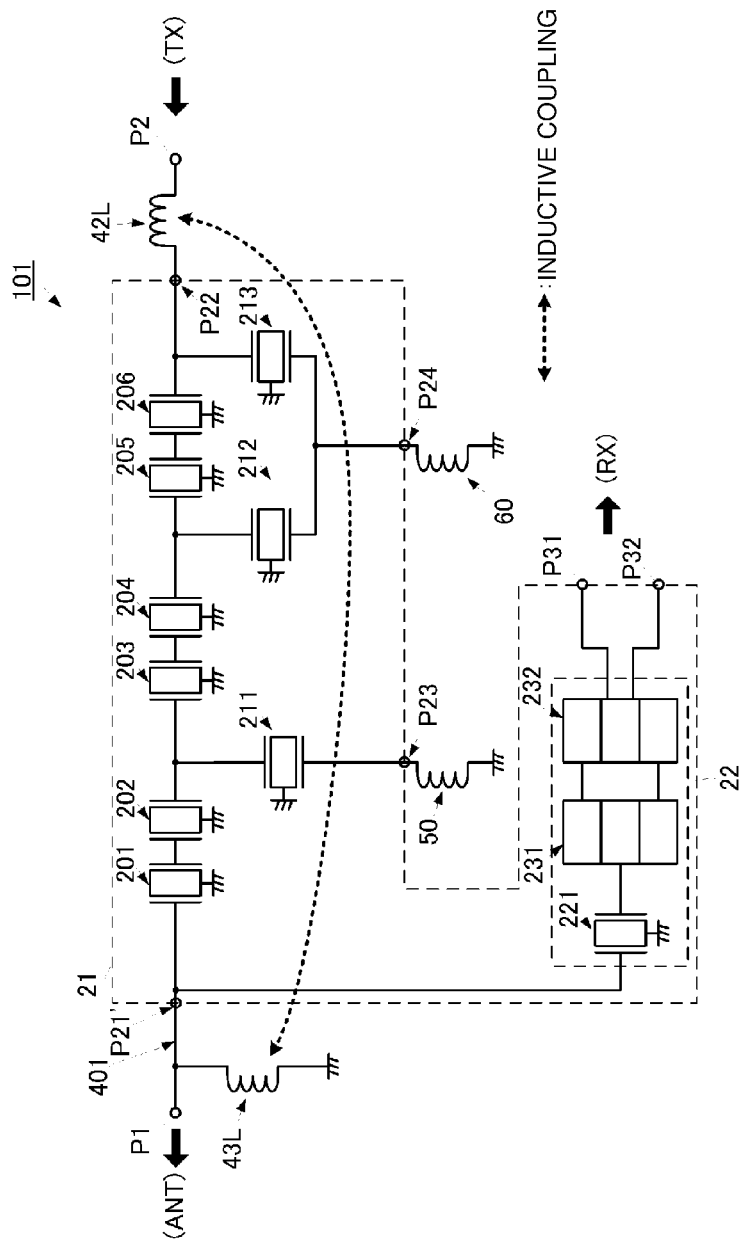
FIG. 7 is an equivalent circuit diagram of a high frequency module including a duplexer configuration.

The high frequency module have the unique structure described above is able to be used, as a specific application example, in a duplexer structure shown in FIG. 7. FIG. 7 is an equivalent circuit diagram of a high frequency module including the duplexer structure.

A high frequency module 101 includes a filter unit 21, the first external connection terminal P1, the second external connection terminal P2, and a third external connection terminal defining and functioning as third terminals P31, P32 of the filter unit 21. The first external connection terminal P1 is connected to an antenna, the second external connection terminal P2 is connected to a transmission circuit, and the third external connection terminal (third terminals P31 and P32) is connected to a receiving circuit, as a specific application example.

The filter unit 21 includes a first series connection terminal P21', the second series connection terminal P22, a first shunt connection terminal P23, the second shunt connection terminal P24, and the third terminals P31 and P32.

The first series connection terminal P21' is connected to the first external connection terminal P1 through the connection line 401. The inductor 43L corresponding to the first matching circuit is connected between the connection line 401 and the ground. The second series connection terminal P22 is connected to the second external connection terminal P2 through the inductor 42L corresponding to the second matching circuit.

The plurality of SAW resonators 201, 202, 203, 204, 205, and 206 are connected in series between the first series connection terminal P21' and the second series connection terminal P22.

The connection point of the SAW resonator 202 and the SAW resonator 203 is connected to the first shunt connection terminal P23 through the SAW resonator 211. The first shunt connection terminal P23 is connected to the ground through the inductor 50.

The connection point of the SAW resonator 204 and the SAW resonator 205 is connected to the second shunt connection terminal P24 through the SAW resonator 212. A connection point of the SAW resonator 206 and the second series connection terminal P22 is connected to the second shunt connection terminal P24 through the SAW resonator 213. The second shunt connection terminal P24 is connected to the ground through the inductor 60.

With this configuration, by combining the bandpass characteristics and the attenuation characteristics of the SAW resonators 201-208, 211, 212, and 213 between the first series connection terminal P21' and the second series connection terminal P22, the filter unit 21 realizes a desired first bandpass characteristic and a desired first attenuation characteristic outside a first pass band between the first and second series connection terminals of the filter unit 21.

A SAW resonator 221 and longitudinally-coupled SAW resonators 231, 232 are connected in series between the first series connection terminal P21' and the third terminals P31, P32. The SAW resonator 221 and the longitudinally-coupled SAW resonators 231, 232 define a second filter unit 22. With this configuration, by combining bandpass characteristics and attenuation characteristics of the SAW resonators 221, 231, and 232 between the first series connection terminal P21' and the third terminals P31, P32, the filter unit 21 realizes a desired second bandpass characteristic and a desired second attenuation characteristic outside a second pass band between the first series connection terminal P21' and the third terminals P31, P32 of the filter unit 21. The second pass band is a different frequency band from the first pass band, and is set so as to be within an attenuation band range outside the first pass band.

With this, the filter unit 21 defines and functions as a duplexer in which the first series connection terminal P21' serves as a common terminal and the second series connection terminal P22 and the third terminals P31, P32 define and function as individual terminals.

Further, in the high frequency module 101, the inductor 42L and the inductor 43L are inductively coupled to each other. Then, by adjusting a coupling degree of the above coupling, the first attenuation characteristic are adjustable.

Here, using the unique structure of the present preferred embodiment makes it possible to adjust the band width and attenuation of a frequency band where attenuation in the first attenuation characteristic is made large so as to overlap with the second pass band. This is realized by adjusting the coupling degree between inductor 42L and the inductor 43L.

Figure 8:
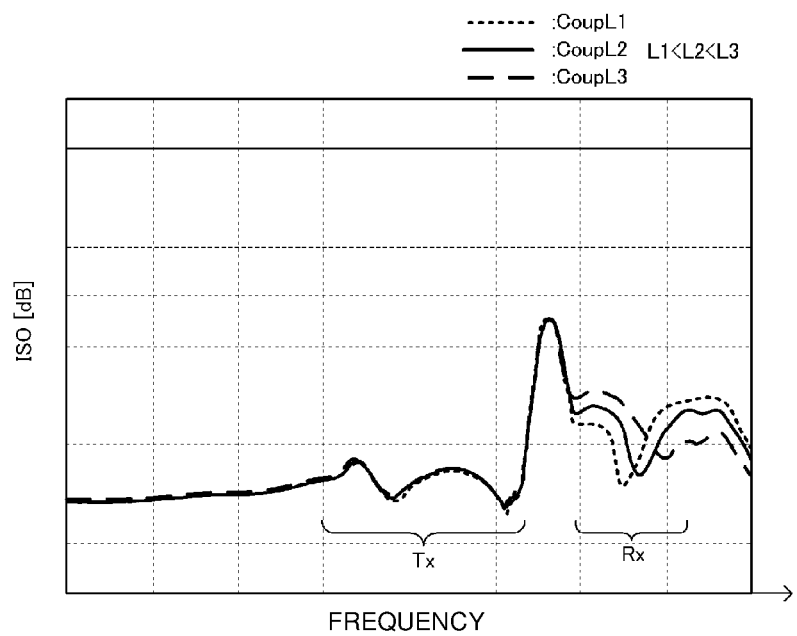
FIG. 8 is a graph illustrating a change in isolation between a second external connection terminal and a third external connection terminal of a high frequency module when a coupling degree of inductive coupling between the first matching circuit and the second matching circuit is changed.

FIG. 8 is a graph illustrating a change in isolation between the second external connection terminal and the third external connection terminal of a high frequency module when a coupling degree of inductive coupling between the first matching circuit and the second matching circuit is changed. The horizontal axis in FIG. 8 represents a frequency, and the vertical axis therein represents an amount of isolation. In FIG. 8, as the amount of isolation is lower, it is indicated that the isolation is strongly caused between the second series connection terminal and the third terminals. A dotted line characteristic shown in FIG. 8 indicates a case in which inductive coupling is weak. A solid line characteristic therein indicates a case in which the inductive coupling is stronger than that of the dotted line characteristic. A broken line characteristic therein indicates a case in which the inductive coupling is stronger than that of the solid line characteristic.

As shown in FIG. 8, as the inductive coupling is stronger, the attenuation pole frequency that appears near the pass band of a receiving circuit Rx (the third terminals side) is higher. Because of this, adjusting the inductive coupling makes it possible to adjust the amount of isolation and the isolation characteristic in the pass band of the receiving circuit Rx. Further, as shown in FIG. 8, even when the inductive coupling is adjusted, the amount of isolation and the isolation characteristic in the pass band of a transmission circuit Tx (the second terminal side) hardly change.

As discussed above, using the unique structure of the high frequency module 101 makes it possible to appropriately adjust the isolation characteristic between the second series connection terminal and the third terminals. In other words, the isolation characteristic between the transmission circuit and the receiving circuit is significantly improved or optimized.

Although not illustrated, in the case where the capacitors 42C and 43C are used in place of the inductors 42L and 43L in the first matching circuit and the second matching circuit, respectively, and the first matching circuit and the second matching circuit are capacitively coupled to each other, as the capacitive coupling is stronger, the attenuation pole frequency that appears near the pass band of the receiving circuit Rx is lower. Because of this, adjusting the capacitive coupling makes it possible to adjust the amount of isolation and the isolation characteristic in the pass band of the receiving circuit Rx (the third terminals side). Further, even when the capacitive coupling is adjusted, the amount of isolation and the isolation characteristic in the pass band of the transmission circuit Tx hardly change. As discussed thus far, it is also possible to appropriately adjust the isolation characteristic between the second series connection terminal and the third terminals by appropriately adjusting the capacitive coupling.

First Structure

Figure 9:
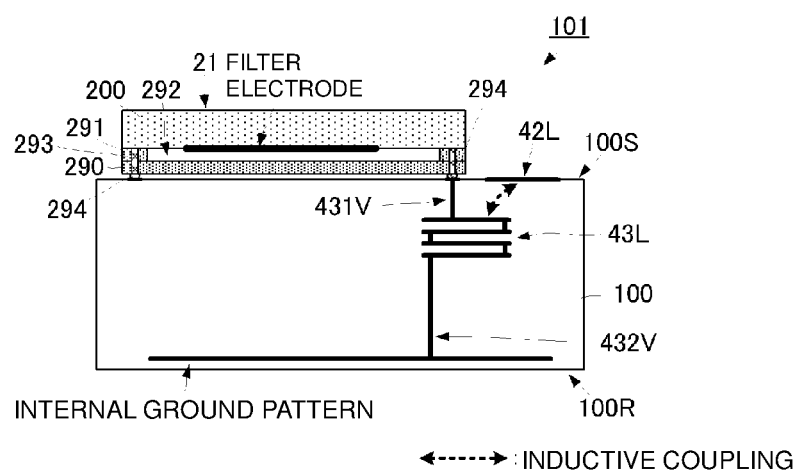
FIG. 9 is a conceptual side view illustrating a main structure of a first structure of a high frequency module.

FIG. 9 is a conceptual side view illustrating a main structure of the high frequency module. The high frequency module 101 includes a laminated substrate 100, a filter substrate 200, a cover layer 290, and a side surface cover layer 291.

The laminated substrate 100 is preferably formed by laminating a plurality of dielectric layers. On a top surface (mounting surface) 100S and in internal layers of the laminated substrate 100, electrodes of predetermined patterns are formed, and wiring patterns excluding the filter unit 21 of the high frequency module 101, the inductors 42L, 43L, and so on are formed. On a bottom surface 100R of the laminated substrate 100, external connection electrodes are formed so that the above-described first external connection terminal P1, second external connection terminal P2, and third external connection terminal are realized with the external connection electrodes.

The filter unit 21 includes the filter substrate 200, the cover layer 290, the side surface cover layer 291, a connection electrode 293, and a mounting electrode 294.

The filter substrate 200 is preferably a plate-shaped piezoelectric substrate. On a first principal surface of the filter substrate 200, a filter electrode, a wiring pattern, and the like are formed. The filter electrode is formed of what is called an IDT electrode, for example. By forming the IDT electrode on the principal surface of the piezoelectric substrate in this manner, the above-described SAW resonators are realized. The plate-shaped cover layer 290 is disposed on the first principal surface side of the filter substrate 200. The cover layer 290 is made of a plate-shaped insulating material and formed in the same shape as the filter substrate 200 when viewed from above. Further, the cover layer 290 overlaps with the filter substrate 200 when viewed from above, and is spaced from the first principal surface of the filter substrate 200 at a predetermined interval.

The side surface cover layer 291 is disposed between the first principal surface of the filter substrate 200 and the cover layer 290. The side surface cover layer 291 is also made of an insulating material, and extends along the entire circumference of the filter substrate 200 and the cover layer 290, only within a predetermined width range from the circumference outer edge toward the interior. In other words, the side surface cover layer 291 has a frame-shaped structure having an opening at the center thereof.

By the cover layer 290 and the side surface cover layer 291 being disposed in this manner, a region in the first principal surface of the filter substrate 200 where the filter electrode is disposed is located in a shielded space 292 defined by the filter substrate 200, the cover layer 290, and the side surface cover layer 291. This makes it possible to improve resonant characteristics of the SAW resonators and realize desired characteristics of the filter with precision.

The connection electrode 293 preferably has one end thereof in contact with the first principal surface of the filter substrate 200 and the other end thereof exposed to a surface of the cover layer 290 on the opposite side to the filter substrate 200. In this case, the connection electrode 293 penetrates the side surface cover layer 291 and the cover layer 290. The one end of the connection electrode 293 is connected to the wiring pattern on the first principal surface of the filter substrate 200.

The mounting electrode 294 is connected to the other end of the connection electrode 293 and protrudes from the surface of the cover layer 290 on the opposite side to the filter substrate 200. Providing a plurality of pairs of the connection electrode 293 and the mounting electrode 294 realizes the first series connection terminal P21', the second series connection terminal P22, the third terminals P31 and P32, the first shunt connection terminal P23, and the second shunt connection terminal P24 of the filter unit 21. Note that a bump using solder, Au, or the like may be provided at the other end of the connection electrode 293, and the connection electrode 293 may be connected to the mounting electrode 294 through the bump.

With the unique structure described above, the filter unit 21 has what is called a wafer level package (WLP) structure, such that the filter unit 21 is compact.

The filter unit 21 with this WLP structure is mounted on the top surface 100S of the laminated substrate 100. As a result, the filter unit 21 is connected to the first external connection terminal P1, the second external connection terminal P2, and the third external connection terminal.

The inductor 43L includes a spiral electrode that is provided inside the laminated substrate 100. The spiral electrode is realized using tube-shape linear electrodes, a portion of which are cut and which are provided in the plurality of dielectric layers of the laminated substrate 100 and interlayer connection electrodes. The linear electrodes in the respective dielectric layers are connected by the interlayer connection electrodes in the lamination direction so as to define a single linear electrode. With this configuration, the spiral electrode whose central axis extends along the lamination direction is realized. One end of the spiral electrode of the inductor 43L is connected, through a via conductor 431V, to a land electrode where the mounting electrode 294 defining and functioning as the first series connection terminal P21' of the filter unit 21 is mounted. The land electrode is provided on the top surface 100S of the laminated substrate 100. The other end of the spiral electrode of the inductor 43L is connected, through a via conductor 432V, to an internal ground pattern in the vicinity of the bottom surface 100R within the laminated substrate 100. Note that the inductor 42L includes a linear electrode that is located on the top surface 100S of the laminated substrate 100.

Further, the spiral electrode of the inductor 43L at least partially overlaps with the linear electrode of the inductor 42L, when viewed from above.

With this unique structure, as indicated by thick broken line arrows in FIG. 9, inductive coupling is generated between the inductor 42L, which includes the linear electrode pattern located on the top surface 100S of the laminated substrate 100, and the inductor 43L, which includes the spiral electrode inside the laminated substrate 100. Adopting this configuration makes it possible to realize the high frequency module 101 having desired attenuation characteristics without additionally providing circuit elements for adjusting the attenuation characteristics.

In this case, the coupling degree between the inductor 42L and the inductor 43L are adjustable by changing a distance between the electrode pattern of the inductor 42L and the spiral electrode of the inductor 43L as well as an area where the above electrode pattern and the spiral pattern overlap each other. This makes it possible to adjust the attenuation characteristics of the high frequency module 101 so as to realize the desired attenuation characteristics more precisely.

Figure 10:
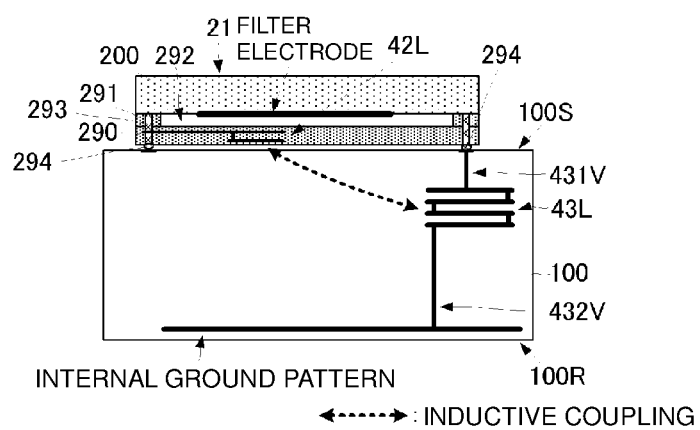
FIG. 10 is a conceptual side view illustrating a main structure of a variation on the first structure of the high frequency module.

It is to be noted that, as shown in FIG. 10, the inductor 42L is not provided inside the laminated substrate 100, but provided in the cover layer 290. Like the inductor 43L, the inductor 42L includes a spiral electrode. Further, the spiral electrode defining the inductor 42L and the spiral electrode defining the inductor 43L are close to each other. As a result, in the same manner as described above, inductive coupling is generated between the inductor 42L and the inductor 43L, as indicated by thick broken line arrows in FIG. 10.

Second Structure

Figure 11:
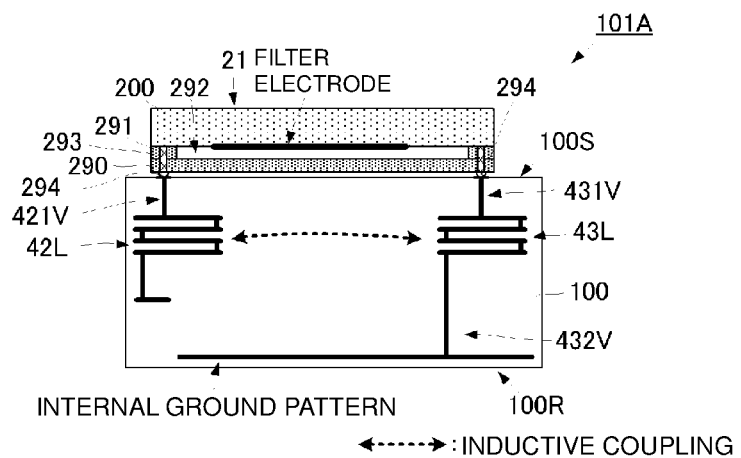
FIG. 11 is a conceptual plan view illustrating a main structure of a second structure of a high frequency module.

FIG. 11 is a conceptual side view illustrating a main structure of a high frequency module. In a high frequency module 101A shown in FIG. 11, the inductor 42L is not located on the top surface 100S of the laminated substrate 100, but is realized by an electrode pattern located inside the laminated substrate 100. Other constituent elements of the high frequency module 101A are the same as those of the high frequency module 101 shown in FIG. 9, and descriptions thereof are omitted herein.

Similar to the inductor 43L, the inductor 42L is located inside the laminated substrate 100 and includes a spiral electrode whose central axis extends along the lamination direction. One end of the spiral electrode of the inductor 42L is connected, through a via conductor 421V, to a land electrode where the mounting electrode 294 defining and functioning as the second series connection terminal P22 of the filter unit 21 is mounted. The other end of the spiral electrode of the inductor 42L is connected, through a via conductor, to an external connection electrode defining and functioning as the second external connection terminal P2.

Further, the spiral electrode of the inductor 42L at least partially overlaps with the spiral electrode of the inductor 43L when viewed in a direction parallel or substantially parallel to the top surface 100S of the laminated substrate 100.

With this configuration, inductive coupling is generated between the inductor 42L and the inductor 43L including the spiral electrodes inside the laminated substrate 100, as indicated by thick broken line arrows in FIG. 11. In this case, by changing a distance between the spiral electrode of the inductor 42L and the spiral electrode of the inductor 43L, the coupling degree between the inductor 42L and the inductor 43L are adjustable. This makes it possible to adjust the attenuation characteristics of the high frequency module 101 and realize the desired attenuation characteristics more precisely.

Note that in the present preferred embodiment, since the inductor 42L and the inductor 43L are provided inside the laminated substrate 100, it is not necessary to provide regions to provide the inductor 42L and the inductor 43L on the top surface 100S of the laminated substrate 100. With this, an area of the laminated substrate 100 when viewed from above is small and a plane surface area of the high frequency module 101A is small.

Third Structure

Figure 12:
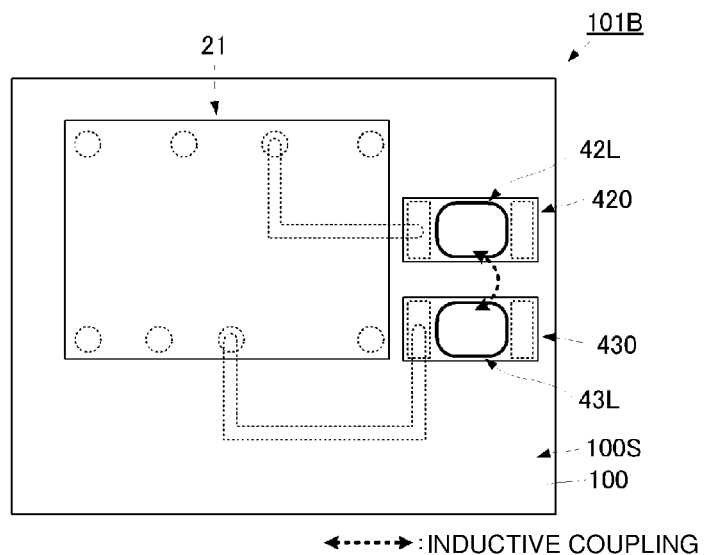
FIG. 12 is a conceptual side view illustrating a main structure of a third structure of a high frequency module.

FIG. 12 is a conceptual plan view illustrating a main structure of a high frequency module. A high frequency module 101B includes the filter unit 21, the laminated substrate 100, and surface-mount circuit elements 420 and 430.

The laminated substrate 100 is preferably formed by laminating a plurality of dielectric layers. On the top surface (mounting surface) 100S and in the internal layers of the laminated substrate 100, electrodes of predetermined patterns are formed. On the top surface 100S of the laminated substrate 100, the filter unit 21 and the surface-mount circuit elements 420, 430 are mounted. The filter unit 21 has the WLP structure as shown in FIG. 9.

The inductor 42L is realized by the surface-mount circuit element 420, while the inductor 43L is realized by the surface-mount circuit element 430. More specifically, the surface-mount circuit elements 420 and 430 each include a housing made of an insulating material and having a rectangular or substantially rectangular parallelepiped shape, and spiral electrodes defining and functioning as the inductors 42L and 43L, respectively, are provided inside the housings. Each of the spiral electrodes is realized using tube-shaped linear electrodes which extend along the outer circumference of the housing, a portion of which are cut and interlayer connection electrodes. The linear electrodes in the respective layers are connected by the interlayer connection electrodes so as to define a single linear electrode. Both ends of the spiral electrode are connected to external connection electrodes located on both end surfaces of the housing opposing each other. The surface-mount circuit elements 420 and 430 with the structure described above are mounted on the top surface 100S of the laminated substrate 100 so that the central axis of each spiral electrode is perpendicular or substantially perpendicular to the top surface 100S of the laminated substrate 100.

The second series connection terminal P22 of the filter unit 21 and the second external connection terminal P2 are connected to a mounting land of the surface-mount circuit element 420. Further, a connection line of the first series connection terminal P21' of the filter unit 21 and the first external connection terminal P1 is provided on the top surface 100S and at the inside of the laminated substrate 100, and the ground electrode is provided inside the laminated substrate 100. This connection line and the ground electrode are connected to a mounting land of the surface-mount circuit element 430.

Then, the surface-mount circuit elements 420 and 430 are disposed so that a longer side surface of the surface-mount circuit element 420 and a longer side surface of the surface-mount circuit element 430 come close to each other and oppose each other. With this, inductive coupling is generated between the inductor 42L including the spiral electrode in the surface-mount circuit element 420 and the inductor 43L including the spiral electrode in the surface-mount circuit element 430, as indicated by thick broken line arrows in FIG. 12. In this case, the coupling degree between the inductor 42L and the inductor 43L are adjustable by adjusting a distance between the surface-mount circuit element 420 and the surface-mount circuit element 430, orientations of the surface-mount circuit elements 420 and 430, or the like. This makes it possible to adjust the attenuation characteristics of the high frequency module 101B and realize the desired attenuation characteristics more precisely.

In FIG. 12, an example of arrangement in which a longer side surface of the surface-mount circuit element 420 and a longer side surface of the surface-mount circuit element 430 oppose each other is illustrated. However, such arrangement may be carried out such that a shorter side surface of the surface-mount circuit element 420 (an end surface where the external connection electrode is located) and a longer side surface of the surface-mount circuit element 430 oppose each other. Note that, however, with the arrangement in which a longer side surface of the surface-mount circuit element 420 and a longer side surface of the surface-mount circuit element 430 oppose each other, a stronger inductive coupling is realized more easily.

Further, in FIG. 12, an example in which the surface-mount circuit elements 420 and 430 are mounted so that the central axis of each spiral electrode is perpendicular or substantially perpendicular to the top surface 100S of the laminated substrate 100. However, the surface-mount circuit elements 420 and 430 may be mounted so that the central axis of each spiral electrode is parallel or substantially parallel to the top surface 100S of the laminated substrate 100.

Fourth Structure

Figure 13:
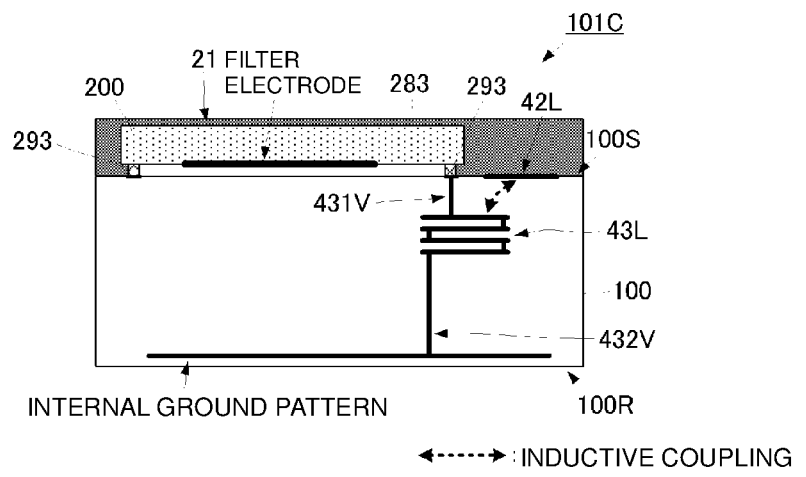
FIG. 13 is a conceptual plan view illustrating a main structure of a fourth structure of a high frequency module.

FIG. 13 is a conceptual side view illustrating a main structure of a high frequency module. In a high frequency module 101C shown in FIG. 13, the filter unit 21 is not realized with the WLP structure shown in FIG. 9, but realized with what is called a bare chip. Other constituent elements of the high frequency module 101C are the same as those of the high frequency module 101 shown in FIG. 9, and descriptions thereof are omitted herein.

The filter substrate 200 of the filter unit 21 preferably is a plate-shaped piezoelectric substrate. On the first principal surface of the filter substrate 200, a filter electrode, a wiring pattern, and the like are provided. The filter electrode preferably is an IDT electrode, for example. The filter substrate 200 is mounted through the connection electrode 293 protruding from the first principal surface side of the filter substrate 200 so that the first principal surface side opposes the top surface 100S of the laminated substrate 100 at a predetermined interval therebetween. The one end of the connection electrode 293 is connected to the wiring pattern located on the first principal surface of the filter substrate 200. The other end of the connection electrode 293 is connected to the wiring pattern located on the top surface 100S of the laminated substrate 100. A resin layer 283 that seals the filter unit 200 is applied to the top surface 100S of the laminated substrate 100 on which the filter substrate 200 is disposed. Note that, however, the resin layer 283 is not applied to the IDT electrode, and a portion of the IDT electrode has a hollow structure.

With this structure, the SAW resonators are realized. Further, providing the plurality of connection electrodes 293 realizes the first series connection terminal P21', the second series connection terminal P22, the third terminals P31 and P32, the first shunt connection terminal P23, and the second shunt connection terminal P24 of the filter unit 21 discussed above.

Also in this structure, as indicated by thick broken line arrows in FIG. 13, inductive coupling is generated between the inductor 42L, which includes the linear electrode pattern located on the top surface 100S of the laminated substrate 100, and the inductor 43L, which includes the spiral electrode inside the laminated substrate 100. This makes it possible to realize the high frequency module 101C having desired attenuation characteristics like the above-described first structure.

Note that in the high frequency module 101C, although the inductors 42L and 43L are realized with the electrodes located on the top surface 100S or at the inside of the laminated substrate 100, the inductors 42L and 43L may be realized with surface-mount circuit elements instead.

Fifth Structure

Figure 14:
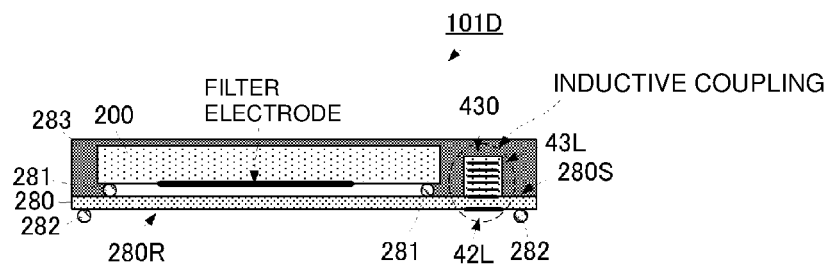
FIG. 14 is a conceptual side view illustrating a main structure of a fifth structure of a high frequency module.

FIG. 14 is a conceptual side view illustrating a main structure of a high frequency module. A high frequency module 101D shown in FIG. 14 is realized using what is called a chip size package (CSP) structure.

The high frequency module 101D includes the filter substrate 200. On the first principal surface of the filter substrate 200, there are provided a filter electrode, a wiring pattern, and the like to define the filter unit 21 in the manner discussed above.

The high frequency module 101D further includes a filter mounting substrate 280. The filter mounting substrate 280 is, for example, an alumina substrate, and an area thereof is larger than that of the filter substrate 200 by a predetermined amount when viewed from above. An electrode of a predetermined pattern is provided on the filter mounting substrate 280.

The filter substrate 200 is mounted on a top surface (mounting surface) 280S of the filter mounting substrate 280 through a bump conductor 281 so that the first principal surface faces the filter mounting substrate 280 side. Further, the surface-mount circuit element 430 of the inductor 43L is mounted on the top surface 280S of the filter mounting substrate 280. On a bottom surface 280R of the filter mounting substrate 280, there are provided a linear electrode of the inductor 42L and an external connection bump conductor 282.

The resin layer 283 is applied to the top surface 280S of the filter mounting substrate 280. However, the resin layer 283 is not applied to the IDT electrode, and a portion of the IDT electrode has a hollow structure. This makes it possible to prevent the filter electrode and the wiring pattern from being exposed to an external environment and improve the resonant characteristic of the SAW resonator, such that desired characteristics of the filter are realized with precision.

Then, the linear electrode of the inductor 42L and the spiral electrode of the inductor 43L at least partially overlap each other when viewed from above. This makes it possible to generate inductive coupling between the inductor 42L and the inductor 43L, as shown in FIG. 14. In particular, in the structure of the present preferred embodiment, because an interval (distance) between the linear electrode of the inductor 42L and the spiral electrode of the inductor 43L is shortened, a stronger inductive coupling is realized with ease.

In addition, since the overall high frequency module 101D preferably has the CSP structure, the high frequency module 101D is compact and thin.

In the module structures discussed above, examples in which an inductor is included in a matching circuit are given. Note that, however, in the case where the matching circuit includes a capacitor, the capacitor preferably is able to be realized with the same structure. For example, the capacitor may be realized with a surface-mount laminated capacitor element. Further, the capacitor may be realized with a plurality of plate electrodes that are provided in different layers inside a laminated substrate, a cover layer, or the like so as to oppose each other. Furthermore, the capacitor may be realized with an electrode pattern provided on the top surface of a laminated substrate, a filter mounting substrate, or the like.

Although the above-described filter unit 20 preferably is a ladder connection-type filter, the filter unit may be a longitudinally-coupled resonator filter, for example. Also in this case, a high frequency module having desired attenuation characteristics is able to be realized by adjusting inductive coupling or capacitive coupling between the first matching circuit and the second matching circuit discussed above.

Note that the matching circuits 41 through 44 may be a complex circuit of a plurality of inductors combined, a plurality of capacitors combined, or inductors and capacitors combined.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high frequency module comprising:
   a first external connection terminal;
   a second external connection terminal;
   a filter unit connected between the first external connection terminal and the second external connection terminal;
   a first matching circuit connected between the first external connection terminal and the filter unit; and
   a second matching circuit connected between the second external connection terminal and the filter unit; wherein
   the first matching circuit and the second matching circuit are inductively or capacitively coupled to each other;
   the filter unit includes:
      a first series connection terminal connected to the first external connection terminal;
      a second series connection terminal connected to the second external connection terminal;

a plurality of series connection filter devices connected in series between the first series connection terminal and the second series connection terminal; and
a third terminal and a second filter unit; and
the second filter unit is connected between the third terminal and a connection line that connects the first series connection terminal and the filter device to be connected to the first series connection terminal.

2. The high frequency module according to claim 1, further comprising:
a filter substrate on a first principal surface of which an IDT electrode of the filter unit is located; and
a plate-shaped filter mounting substrate which is disposed on the first principal surface side of the filter substrate and on which the first principal surface side of the filter substrate is mounted; wherein
the first matching circuit and the second matching circuit are mounted or located on the filter mounting substrate.

3. The high frequency module according to claim 1, wherein the first matching circuit and the second matching circuit are inductively or capacitively coupled to each other such that impedance of the filter unit outside a pass band changes.

4. The high frequency module according to claim 3, wherein the first matching circuit and the second matching circuit are inductively or capacitively coupled to each other such that an attenuation pole frequency of the filter unit outside the pass band changes.

5. The high frequency module according to claim 1, wherein
the first matching circuit is a series connection matching circuit connected in series between the first external connection terminal and the filter unit, or a shunt connection-type matching circuit connected between the ground and a connection line that connects the first external connection terminal and the filter unit; and
the second matching circuit is a series connection matching circuit connected in series between the second external connection terminal and the filter unit, or a shunt connection-type matching circuit connected between the ground and a connection line that connects the second external connection terminal and the filter unit.

6. The high frequency module according to claim 1, wherein the high-frequency module is a duplexer.

7. The high frequency module according to claim 1, further comprising:
a filter substrate on a first principal surface of which an IDT electrode of the filter unit is provided;
a cover layer opposing the first principal surface of the filter substrate with an interposed space;
a connection electrode protruding from the first principal surface so as to penetrate the cover layer; and
a laminated substrate where the first matching circuit and the second matching circuit are mounted or located; wherein the first principal surface side faces a mounting surface of the laminated substrate; and
the filter substrate is connected to the laminated substrate through the connection electrode.

8. The high frequency module according to claim 7, wherein the first matching circuit or the second matching circuit is located inside the cover layer.

9. The high frequency module according to claim 7, wherein
the first matching circuit and the second matching circuit each include a surface-mount circuit element mounted on the mounting surface of the laminated substrate; and
the first matching circuit and the second matching circuit are close to each other.

10. The high frequency module according to claim 9, wherein
the first matching circuit and the second matching circuit each include a housing and a spiral conductor located inside the housing and having an outer circumferential shape that is rectangular or substantially rectangular when viewed from above; and
a longer side of the housing of the first matching circuit is close to a longer side of the housing of the second matching circuit.

11. The high frequency module according to claim 7, wherein
the first matching circuit and the second matching circuit are located on the mounting surface of the laminated substrate or located inside the laminated substrate; and
the first matching circuit and the second matching circuit overlap with each other when viewed in a lamination direction of the laminated substrate.

12. The high frequency module according to claim 7, wherein
the first matching circuit and the second matching circuit are located inside the laminated substrate; and
the first matching circuit and the second matching circuit overlap with each other when viewed in a direction parallel or substantially parallel to the mounting surface of the laminated substrate.

13. The high frequency module according to claim 1, further comprising:
a filter substrate on a first principal surface of which an IDT electrode of the filter unit is provided;
a connection electrode protruding from the first principal surface;
a laminated substrate where the first matching circuit and the second matching circuit are mounted or located; and
a resin layer that seals the filter unit; wherein
the first principal surface side opposes a mounting surface of the laminated substrate with an interposed space;
the filter substrate is connected to the laminated substrate through the connection electrode; and
the resin layer covers the mounting surface of the laminated substrate where the filter substrate is disposed.

* * * * *